(12) United States Patent
Abed et al.

(10) Patent No.: US 9,598,776 B2
(45) Date of Patent: Mar. 21, 2017

(54) PHOTOSINTERING OF MICRON-SIZED COPPER PARTICLES

(71) Applicant: PEN INC., Deerfield Beach, FL (US)

(72) Inventors: Ovadia Abed, Austin, TX (US); Valerie Kaye Ginsberg, Austin, TX (US); James P. Novak, Austin, TX (US)

(73) Assignee: PEN Inc., Deerfield Beach, FL (US)

( * ) Notice: Subject to any disclaimer, the term of this patent is extended or adjusted under 35 U.S.C. 154(b) by 127 days.

(21) Appl. No.: 14/413,294

(22) PCT Filed: Jul. 9, 2013

(86) PCT No.: PCT/US2013/049635
§ 371 (c)(1),
(2) Date: Jan. 7, 2015

(87) PCT Pub. No.: WO2014/011578
PCT Pub. Date: Jan. 16, 2014

(65) Prior Publication Data
US 2015/0147486 A1 May 28, 2015

Related U.S. Application Data

(60) Provisional application No. 61/669,431, filed on Jul. 9, 2012.

(51) Int. Cl.
*B05D 3/02* (2006.01)
*B05D 3/06* (2006.01)
(Continued)

(52) U.S. Cl.
CPC .......... *C23C 24/106* (2013.01); *C09D 11/52* (2013.01); *H01B 1/22* (2013.01); *H05K 1/097* (2013.01);
(Continued)

(58) Field of Classification Search
CPC ...... C23C 24/103; C23C 24/016; C09D 11/52
See application file for complete search history.

(56) References Cited

U.S. PATENT DOCUMENTS 3,239,597 A 3/1966 Flynn
3,580,731 A 5/1971 Milewski et al.
(Continued)

FOREIGN PATENT DOCUMENTS

CN 1509206 A 6/2004
CN 1803940 7/2006
(Continued)

OTHER PUBLICATIONS

Jung et al; "Air-stable silver-coated copper particles of sub-micrometer size"; Journal of Colloid and Interface Science 364 (2011); Aug. 23, 2011; pp. 574-581; Elsevier, Inc.; The Netherlands.
(Continued)

*Primary Examiner* — Michael Wieczorek
(74) *Attorney, Agent, or Firm* — Kelly Kordzik; Matheson Keys Daffer & Kordzik PLLC

(57) ABSTRACT

Micron-sized metal particles in an ink or paste composition are deposited onto a substrate and then photosimered. The substrate may comprise a polymeric material. The polymeric substrate may have a coefficient of thermal expansion greater than two times the coefficient of thermal expansion of the photosimered ink or paste composition.

17 Claims, 9 Drawing Sheets

(51) Int. Cl.
*C23C 24/10* (2006.01)
*H01B 1/22* (2006.01)
*H05K 1/09* (2006.01)
*C09D 11/52* (2014.01)
*H05K 3/12* (2006.01)

(52) U.S. Cl.
CPC ... *H05K 3/1283* (2013.01); *H05K 2203/1545* (2013.01)

(56) References Cited

U.S. PATENT DOCUMENTS

| | | | |
|---|---|---|---|
| 3,796,598 A | 3/1974 | Gejyo et al. | |
| 3,950,605 A | 4/1976 | Hori et al. | |
| 4,093,466 A | 6/1978 | Davis | |
| 4,151,008 A | 4/1979 | Kirkpatrick | |
| 4,194,913 A | 3/1980 | Davis | |
| RE30,434 E | 11/1980 | Davis | |
| 4,234,631 A | 11/1980 | Davis | |
| 4,331,518 A | 5/1982 | Wilson | |
| 4,591,951 A | 5/1986 | Iwamoto et al. | |
| 4,640,746 A | 2/1987 | Nobel et al. | |
| 4,681,670 A | 7/1987 | Nobel et al. | |
| 4,749,626 A | 6/1988 | Kadija et al. | |
| 4,756,791 A | 7/1988 | D'Angelo et al. | |
| 4,922,322 A | 5/1990 | Mathew | |
| 4,935,312 A | 6/1990 | Nakayama et al. | |
| 4,959,278 A | 9/1990 | Shimauchi et al. | |
| 4,997,516 A | 3/1991 | Adler | |
| 4,997,722 A | 3/1991 | Adler | |
| 5,008,997 A | 4/1991 | Phy | |
| 5,039,576 A | 8/1991 | Wilson | |
| 5,049,718 A | 9/1991 | Spletter et al. | |
| 5,130,275 A | 7/1992 | Dion | |
| 5,160,422 A | 11/1992 | Nishimura et al. | |
| 5,202,179 A | 4/1993 | Kasahara | |
| 5,234,513 A | 8/1993 | Inoue et al. | |
| 5,260,849 A | 11/1993 | Kasahara | |
| 5,277,756 A | 1/1994 | Dion | |
| 5,320,737 A | 6/1994 | Chao et al. | |
| 5,322,823 A | 6/1994 | Ueda et al. | |
| 5,384,204 A | 1/1995 | Yumoto et al. | |
| 5,393,573 A | 2/1995 | MacKay | |
| 5,439,639 A | 8/1995 | Vianco et al. | |
| 5,492,595 A | 2/1996 | Carano et al. | |
| 5,698,087 A | 12/1997 | Bokisa | |
| 5,724,727 A | 3/1998 | Chopra et al. | |
| 5,730,851 A | 3/1998 | Arrowsmith et al. | |
| 5,750,017 A | 5/1998 | Zhang | |
| 5,798,286 A | 8/1998 | Faraci et al. | |
| 5,807,519 A | 9/1998 | Suzuki et al. | |
| 5,861,076 A | 1/1999 | Adlam | |
| 5,879,568 A | 3/1999 | Urasaki et al. | |
| 5,889,083 A | 3/1999 | Zhu et al. | |
| 5,990,197 A | 11/1999 | Escano et al. | |
| 6,010,771 A | 1/2000 | Isen et al. | |
| 6,093,503 A | 7/2000 | Isoyama et al. | |
| 6,099,713 A | 8/2000 | Yanada et al. | |
| 6,139,777 A | 10/2000 | Omoya et al. | |
| 6,147,400 A | 11/2000 | Faraci et al. | |
| 6,165,386 A | 12/2000 | Endo et al. | |
| 6,200,732 B1 | 3/2001 | Tamura et al. | |
| 6,238,847 B1 | 5/2001 | Axtell et al. | |
| 6,248,455 B1 | 6/2001 | Adams et al. | |
| 6,297,142 B1 | 10/2001 | Mita et al. | |
| 6,306,947 B1 | 10/2001 | Morishima et al. | |
| 6,361,823 B1 | 3/2002 | Bokisa et al. | |
| 6,426,548 B1 | 7/2002 | Mita et al. | |
| 6,433,409 B2 | 8/2002 | Mita et al. | |
| 6,472,459 B2 | 10/2002 | Morales et al. | |
| 6,530,944 B2 | 3/2003 | West et al. | |
| 6,554,914 B1 | 4/2003 | Rozbicki et al. | |
| 6,583,500 B1 | 6/2003 | Abbott et al. | |
| 6,603,205 B2 | 8/2003 | Miura | |
| 6,638,847 B1 | 10/2003 | Cheung et al. | |
| 6,646,330 B2 | 11/2003 | Kubara et al. | |
| 6,651,521 B2 | 11/2003 | Carbone et al. | |
| 6,664,492 B1 | 12/2003 | Babb et al. | |
| 6,679,937 B1 | 1/2004 | Kodas et al. | |
| 6,682,584 B2 | 1/2004 | Pozarnsky et al. | |
| 6,720,499 B2 | 4/2004 | Bokisa et al. | |
| 6,773,827 B2 | 8/2004 | Higuchi | |
| 6,773,828 B1 | 8/2004 | Ooi et al. | |
| 6,774,036 B2 | 8/2004 | Goldstein | |
| 6,783,569 B2 | 8/2004 | Cheon et al. | |
| 6,824,857 B2 * | 11/2004 | Lochun | G08B 13/244 361/748 |
| 6,828,660 B2 | 12/2004 | Abbott | |
| 6,860,981 B2 | 3/2005 | Schetty, III et al. | |
| 6,899,775 B2 | 5/2005 | Hill et al. | |
| 6,917,098 B1 | 7/2005 | Yamunan | |
| 6,951,666 B2 | 10/2005 | Kodas et al. | |
| 7,019,391 B2 | 3/2006 | Tran | |
| 7,062,848 B2 | 6/2006 | Pan et al. | |
| 7,084,067 B2 | 8/2006 | Geusic et al. | |
| 7,087,523 B2 | 8/2006 | Grigoropoulos et al. | |
| 7,153,775 B2 | 12/2006 | Geusic | |
| 7,160,629 B2 | 1/2007 | Crosby | |
| 7,179,362 B2 | 2/2007 | Dietterle et al. | |
| 7,195,702 B2 | 3/2007 | Bokisa, Sr. et al. | |
| 7,215,014 B2 | 5/2007 | Su et al. | |
| 7,252,699 B2 | 8/2007 | Perry et al. | |
| 7,262,603 B1 | 8/2007 | Benton et al. | |
| 7,294,366 B2 | 11/2007 | Renn et al. | |
| 7,297,902 B2 | 11/2007 | Weiss | |
| 7,316,725 B2 | 1/2008 | Kodas et al. | |
| 7,351,667 B2 | 4/2008 | Hwang et al. | |
| 7,357,681 B2 | 4/2008 | Yamagami et al. | |
| 7,384,862 B2 | 6/2008 | Yamazaki et al. | |
| 7,391,116 B2 | 6/2008 | Chen et al. | |
| 7,482,540 B2 | 1/2009 | Shukushima et al. | |
| 7,507,618 B2 | 3/2009 | Dunbar | |
| 7,514,369 B2 | 4/2009 | Li et al. | |
| 7,547,479 B2 | 6/2009 | Wessling | |
| 7,776,196 B2 | 8/2010 | Fujimoto et al. | |
| 7,786,024 B2 | 8/2010 | Stumbo et al. | |
| 7,867,413 B2 | 1/2011 | Lee et al. | |
| 7,879,131 B2 | 2/2011 | Yaniv et al. | |
| 8,647,979 B2 | 2/2014 | Yaniv et al. | |
| 8,911,823 B2 | 12/2014 | Li et al. | |
| 2002/0148386 A1 | 10/2002 | Woosman et al. | |
| 2002/0158342 A1 | 10/2002 | Tuominen et al. | |
| 2002/0185716 A1 | 12/2002 | Abys et al. | |
| 2002/0187364 A1 | 12/2002 | Heber et al. | |
| 2002/0192492 A1 | 12/2002 | Abys | |
| 2003/0025182 A1 | 2/2003 | Abys et al. | |
| 2003/0151030 A1 | 8/2003 | Gurin | |
| 2003/0168639 A1 | 9/2003 | Cheon et al. | |
| 2003/0213614 A1 | 11/2003 | Furusawa | |
| 2003/0226758 A1 | 12/2003 | Egli | |
| 2004/0026256 A1 | 2/2004 | Lindgren | |
| 2004/0026684 A1 | 2/2004 | Empedocies | |
| 2004/0118696 A1 | 6/2004 | Zhang et al. | |
| 2004/0131934 A1 | 7/2004 | Sugnaux et al. | |
| 2004/0132299 A1 | 7/2004 | Matsuda et al. | |
| 2004/0134379 A1 | 7/2004 | Wong et al. | |
| 2004/0147113 A1 | 7/2004 | Yamazaki et al. | |
| 2004/0147618 A1 | 7/2004 | Lee et al. | |
| 2004/0171211 A1 | 9/2004 | Lee et al. | |
| 2004/0175631 A1 | 9/2004 | Crocker et al. | |
| 2004/0192042 A1 | 9/2004 | Sirringhaus et al. | |
| 2004/0218136 A1 | 11/2004 | Imai et al. | |
| 2004/0232000 A1 | 11/2004 | Crosby | |
| 2004/0241532 A1 | 12/2004 | Kim | |
| 2004/0256239 A1 | 12/2004 | Whitlaw et al. | |
| 2005/0019543 A1 | 1/2005 | Lyles | |
| 2005/0026423 A1 | 2/2005 | Yamazaki | |
| 2005/0078158 A1 | 4/2005 | Magdassi et al. | |
| 2005/0097987 A1 | 5/2005 | Kodas et al. | |
| 2005/0145502 A1 | 7/2005 | Schetty, III et al. | |
| 2005/0148164 A1 | 7/2005 | Casey et al. | |
| 2005/0183768 A1 | 8/2005 | Roscheisen et al. | |
| 2005/0218398 A1 | 10/2005 | Tran | |
| 2005/0230042 A1 | 10/2005 | Hasimoto | |

(56) References Cited

U.S. PATENT DOCUMENTS

| | | |
|---|---|---|
| 2005/0249967 A1 | 11/2005 | Egli |
| 2005/0249968 A1 | 11/2005 | Xu et al. |
| 2005/0249969 A1 | 11/2005 | Xu et al. |
| 2005/0274480 A1 | 12/2005 | Barsoum et al. |
| 2006/0001726 A1 | 1/2006 | Kodas et al. |
| 2006/0011267 A1 | 1/2006 | Kay et al. |
| 2006/0054668 A1 | 3/2006 | Severin |
| 2006/0057502 A1 | 3/2006 | Okada et al. |
| 2006/0062701 A1 | 3/2006 | Nakamura et al. |
| 2006/0068218 A1 | 3/2006 | Hooghan |
| 2006/0073680 A1 | 4/2006 | Han et al. |
| 2006/0082952 A1 | 4/2006 | Ogiwara |
| 2006/0090819 A1 | 5/2006 | Egli |
| 2006/0091121 A1 | 5/2006 | Zanolli et al. |
| 2006/0096867 A1 | 5/2006 | Bokisa et al. |
| 2006/0110424 A1 | 5/2006 | Lyles |
| 2006/0111467 A1 | 5/2006 | Reinhardt et al. |
| 2006/0116000 A1 | 6/2006 | Yamamoto |
| 2006/0141268 A1 | 6/2006 | Kalkan et al. |
| 2006/0159838 A1 | 7/2006 | Kowalski et al. |
| 2006/0163743 A1 | 7/2006 | Kuwabara et al. |
| 2006/0163744 A1 | 7/2006 | Vanheusden et al. |
| 2006/0183055 A1 | 8/2006 | O'Neill et al. |
| 2006/0189113 A1 | 8/2006 | Vanheusden et al. |
| 2006/0234519 A1 | 10/2006 | Pan et al. |
| 2006/0240591 A1 | 10/2006 | Grier et al. |
| 2006/0286301 A1 | 12/2006 | Murata et al. |
| 2007/0007144 A1 | 1/2007 | Schetty, III |
| 2007/0040191 A1 | 2/2007 | Bezryadin et al. |
| 2007/0051927 A1 | 3/2007 | Itoh et al. |
| 2007/0074316 A1 | 3/2007 | Alden et al. |
| 2007/0095879 A1 | 5/2007 | Holmes |
| 2007/0105395 A1 | 5/2007 | Kinzel et al. |
| 2007/0117475 A1 | 5/2007 | Tu |
| 2007/0144305 A1 | 6/2007 | Jablonski et al. |
| 2007/0145375 A1 | 6/2007 | Cho |
| 2007/0148972 A1 | 6/2007 | Hara et al. |
| 2007/0158204 A1 | 7/2007 | Taylor et al. |
| 2007/0163643 A1 | 7/2007 | Van Duren |
| 2007/0166453 A1 | 7/2007 | Van Duren et al. |
| 2007/0175296 A1 | 8/2007 | Subramanian et al. |
| 2007/0176991 A1 | 8/2007 | Arai et al. |
| 2007/0190326 A1 | 8/2007 | Perry et al. |
| 2007/0218312 A1 | 9/2007 | Sakuyama et al. |
| 2007/0275262 A1 | 11/2007 | Lin et al. |
| 2007/0281136 A1 | 12/2007 | Hampden-Smith et al. |
| 2007/0281249 A1 | 12/2007 | Tutt et al. |
| 2007/0284700 A1 | 12/2007 | Jackson et al. |
| 2007/0287022 A1 | 12/2007 | Jackson et al. |
| 2007/0287023 A1 | 12/2007 | Jackson et al. |
| 2007/0287024 A1 | 12/2007 | Jackson et al. |
| 2007/0289483 A1 | 12/2007 | Cho et al. |
| 2007/0295530 A1 | 12/2007 | Jackson et al. |
| 2008/0020208 A1 | 1/2008 | Lee et al. |
| 2008/0020304 A1 | 1/2008 | Schroder et al. |
| 2008/0075934 A1 | 3/2008 | Barlow et al. |
| 2008/0083950 A1 | 4/2008 | Pan et al. |
| 2008/0143906 A1 | 6/2008 | Allemand et al. |
| 2008/0160309 A1 | 7/2008 | Kubota |
| 2008/0164557 A1 | 7/2008 | Kim et al. |
| 2008/0169122 A1 | 7/2008 | Shiraishi et al. |
| 2008/0193667 A1 | 8/2008 | Garbar et al. |
| 2008/0241391 A1 | 10/2008 | Kim et al. |
| 2008/0241414 A1 | 10/2008 | Kim et al. |
| 2008/0264205 A1 | 10/2008 | Zeng et al. |
| 2008/0278181 A1 | 11/2008 | Zhong et al. |
| 2008/0286488 A1* | 11/2008 | Li .................. B22F 1/0074 427/541 |
| 2008/0305268 A1 | 12/2008 | Norman et al. |
| 2009/0142481 A1 | 6/2009 | Chopra et al. |
| 2009/0274833 A1 | 11/2009 | Li et al. |
| 2009/0286383 A1 | 11/2009 | Jiang et al. |
| 2010/0000762 A1 | 1/2010 | Yang et al. |
| 2010/0035375 A1 | 2/2010 | Grigoropoulos et al. |
| 2011/0043965 A1 | 2/2011 | Yaniv et al. |
| 2011/0155430 A1 | 6/2011 | Lee et al. |
| 2014/0302255 A1 | 10/2014 | Spicer et al. |
| 2014/0314966 A1 | 10/2014 | Fink et al. |

FOREIGN PATENT DOCUMENTS

| | | |
|---|---|---|
| CN | 101065203 | 10/2007 |
| CN | 101116149 | 1/2008 |
| EP | 1626106 A2 | 2/2006 |
| EP | 1626106 A3 | 8/2006 |
| EP | 1758166 A2 | 2/2007 |
| EP | 2045028 | 4/2009 |
| EP | 2150417 | 2/2010 |
| EP | 1758166 A3 | 9/2011 |
| JP | 62124084 | 6/1987 |
| JP | 10308119 | 11/1998 |
| JP | 11-319538 | 11/1999 |
| JP | 2001-325831 | 11/2001 |
| JP | 2003-292836 | 10/2003 |
| JP | 2003/106573 A1 | 12/2003 |
| JP | 2004/005413 A1 | 1/2004 |
| JP | 2004-127676 | 4/2004 |
| JP | 2004-273592 | 9/2004 |
| JP | 2005-307335 | 11/2005 |
| JP | 2006-026602 | 2/2006 |
| JP | 2006-169592 | 6/2006 |
| JP | 2006-186330 | 7/2006 |
| JP | 2006-229212 | 8/2006 |
| JP | 2006-321948 | 11/2006 |
| JP | 2007-042725 | 2/2007 |
| JP | 2007-321215 | 12/2007 |
| JP | 2007-327058 | 12/2007 |
| JP | 2007-332347 | 12/2007 |
| JP | 2008006513 | 1/2008 |
| JP | 2009-097082 | 5/2009 |
| WO | 97/08924 | 3/1997 |
| WO | 2006/072959 | 7/2006 |
| WO | 2006/076603 | 7/2006 |
| WO | 2007/004033 | 1/2007 |
| WO | 2007/013393 | 2/2007 |
| WO | 2008/144504 | 11/2008 |
| WO | 2009/111393 | 9/2009 |
| WO | 2009/108304 A1 | 9/2011 |

OTHER PUBLICATIONS

RU/ISA; International Search Report and Written Opinion for PCT/US2013/049635 issued Oct. 31, 2013; Moscow, RU.

International Bureau of WIPO, International Preliminary Report on Patentability, International Application No. PCT/US2013/049635, Jan. 22, 2015.

Japanese Patent Office, Final Office Action, Notice of Reasons for Rejection, Japanese Patent Application No. 2012-503530, dated Jan. 13, 2015.

Boettinger et al., "Whisker and Hillock Formation on Sn, Sn-Cu and Sn-Pb Electrodeposits," Acta Materialia, 53, Sep. 8, 2005, pp. 5033-5050.

Champion et al., "Sintering of copper nanopowders under hydrogen: an in situ X-ray diffraction analysis," Materials Science and Engineering A, vol. 360, No. 1-2, Nov. 1, 2003, pp. 258-263.

Curtis et al., "Spray and Inkjet Printing of Hybrid Nanoparticle-Metal-Organic Inks for Ag and Chu Metallizations," Materials Research Society Magazine, 2001, vol. 676, 6 pages.

European Patent Office, European Search Report for International Application No. 10756901.4, dated Oct. 10, 2014.

European Patent Office, European Search Report, Application No. 09747709.5, dated Mar. 12, 2014.

European Patent Office, European Search Report, Application No. 10759242.0, dated Sep. 3, 2014.

European Patent Office, Examination Report, Application No. 08 755 692.4, Apr. 13, 2012.

European Patent Office, Examination Report, Application No. 09774505.3, dated Sep. 26, 2012.

European Patent Office, Examination Report, Application No. 09774505.3, dated Oct. 22, 2014.

(56) References Cited

OTHER PUBLICATIONS

European Patent Office, Supplemental European Search Report for Application No. EP 09774505, Jun. 29, 2011.
European Patent Office, Supplementary European Search Report for Application No. EP08755692, Aug. 6, 2010.
Galyon, "Annotated Tin Whisker Bibliography and Anthology," IEEE Transactions on Electronics Packaging Manufacturing, vol. 28, No. 1, Jan. 2005, pp. 94-122.
International Bureau of WIPO, International Preliminary Report on Patentability for PCT/US2010/042169, Jan. 17, 2012.
International Bureau of WIPO; International Preliminary Report on Patentability, International Application No. PCT/US2009/044196, Nov. 25, 2010, 6 pages.
International Bureau of WIPO; International Preliminary Report on Patentability, International Application No. PCT/US2009/044195, Nov. 25, 2010, 5 pages.
International Bureau of WIPO; International Preliminary Report on Patentability, International Application No. PCT/US2008/063890, Dec. 3, 2009.
International Searching Authority, International Search Report and the Written Opinion, PCT/US08/63890, Aug. 6, 2008, 9 pages.
International Searching Authority, International Search Report and Written Opinion for Application No. PCT/US/09/35717, May 5, 2009, 7 pages.
International Searching Authority, International Search Report and Written Opinion for International Application No. PCT/US09/44196, Jun. 30, 2009, 8 pages.
International Searching Authority, International Search Report and Written Opinion for International Application No. PCT/US09/44195, Jun. 25, 2009, 7 pages.
International Searching Authority, International Search Report and Written Opinion for International Application No. PCT/US09/49510, Oct. 19, 2009.
International Searching Authority, International Search Report and Written Opinion of the International Searching Authority for PCT/US10/28799, May 19, 2010.
International Searching Authority, International Search Report and the Written Opinion for International Application No. PCT/US10/28811, May 18, 2010.
International Searching Authority, International Search Report and the Written Opinion for PCT/US10/042169, mailed on Sep. 7, 2010, 4 pages.
Japanese Patent Office, Decision on Rejection, Japanese Patent Application No. 2011-509765, Sep. 29, 2014.
Japanese Patent Office, Office Action, Notice of Reasons for Rejection, Application No. 2010-549783, Dec. 18, 2012.
Japanese Patent Office, Final Office Action, Notice of Reasons for Rejection, Japanese Patent Application No. 2010-549783, dated Oct. 15, 2013.
Japanese Patent Office, Final Office Action, Notice of Reasons for Rejection, Japanese Patent Application No. 2010-549783, dated Oct. 14, 2014.
Japanese Patent Office, Final Office Action, Notice of Reasons for Rejection, Japanese Patent Application No. 2012-502281, dated Aug. 11, 2014.
Japanese Patent Office, Non-Final Office Action, Japanese Patent Application No. 2011-509765, Jul. 23, 2013.
Japanese Patent Office, Non-Final Office Action, Notice of Reasons for Rejection, Japanese Patent Application No. 2011-516873, dated Oct. 22, 2013, English Translation.
Japanese Patent Office, Non-Final Office Action, Notice of Reasons for Rejection, Japanese Patent Application No. 2012-503530, dated Jan. 21, 2014.
Japanese Patent Office, Non-Final Office Action, Notice of Reasons for Rejection, Japanese Patent Application No. 2011-516873, dated Mar. 24, 2014.
Kim et al., "Cyclic Properties of Si-Cu/Carbon Nanocomposite Anodes for Li-Ion Secondary Batteries", Journal of the Electrochemical Society, vol. 152, No. 3, pp. A-523-A-526, Jan. 24, 2005, retrieved from internet Aug. 26, 2010.
Kogelschatz, "Excimer Lamps: History, Discharge Physics, and Industrial Applications", Proc. SPIE, vol. 5483, 2004, pp. 272-286.
Korean Intellectual Property Office, Chemistry & Biotechnology Examination Bureau, Notice to File a Response, Patent Application No. 10-2010-7022240, May 8, 2012, KR.
Lal et al., "Role of Intrinsic Stresses in the Phenomena of Tin Whiskers in Electrical Connectors," IEEE Transactions on Electronics Packing Manufacturing, vol. 28, No. 1, Jan. 2005, pp. 63-74.
Lee et al., "Spontaneous Growth Mechanism of Tin Whiskers," Acta mater. vol. 46, No. 10, pp. 3701-3714, 1998.
Lu et al., "Ultrahigh Strength and High Electrical Conductivity in Copper," Science Magazine, Apr. 2004, vol. 304, 6 pages.
Mitooka et al., "Effect of Laser Irradiation on Generation and Growth of Whiskers in Tin-Electroplated Film," J. Japan Inst. Metals, vol. 73, No. 3, (2009), pp. 226-233.
MSDS: Fluorad by 3M, Fluorosurfactant FC-4430, Mar. 2, 2002; www.3m.com/paintsandcoatings, 4 pages.
Niizeki et al., "Laser Sintering of Ag Nanopaste Film and Its Application to Bond-Pad Formation," 2008 Electronic Components and Technology Conference, May 27-30, 2008, IEEE, pp. 1745-1750.
Non-Final Office Action, Notice of Reasons for Rejection, Japanese Patent Application No. 2012-502281, mailed Jul. 16, 2013.
Osenbach et al., "Sn Corrosion and Its Influence on Whisker Growth," IEEE Transactions on Electronic Packaging Manufacturing, vol. 30, No. 1, Jan. 2007, pp. 23-35.
Osenbach et al., "Sn Whiskers: Material, Design, Processing, and Post-Plate Reflow Effects and Development of an Overall Phenomenological Theory," IEEE Transactions on Electronics Packaging Manufacturing, vol. 28, No. 1, Jan. 2005, pp. 36-62.
Osterman, "Mitigation Strategies for Tin Whiskers," Release 1.0, Aug. 28, 2002, 11 pages.
Schroder et al., "Broadcast Photonic Curing of Metallic Nanoparticle Films," Nanotechnologies, Inc. publication, 2006 NSTI Nanotechnology Conference and Trade Show, May 7-11, 2006, 4 pages.
Schroeder et al., "Tin Whisker Test Method Development," IEEE Transactions Electronics Packaging Manufacturing, vol. 29, No. 4, Oct. 2006, pp. 231-238.
Shacham-Diamand, "Electroless Copper Deposition Using Glyoxylic Acid as Reducing Agent for Ultralarge Scale Integration Metallization," manuscript published by Electrochemical and Solid-State Letters, Apr. 2000, pp. 279-282, 4 pages.
Shah et al., "Trimming and Printing of Embedded Resistors Using Demand-Mode Ink-Jet Technology and Conductive Polymer," IPC Printed Circuit Expo Mar. 24-28, 2002, pp. 1-5.
Taiwan International Patent & Law Office, Translation of Notice of Office Action and Search Report, Taiwan Invention Patent Application No. 099109236, dated Oct. 23, 2014.
Taiwan International Patent & Law Office, Translation of Notice of Office Action and Search Report, Taiwan Invention Patent Application No. 098116219, dated Oct. 15, 2014.
The State Intellectual Property Office of the People's Republic of China, Notice of the First Office Action, Application No. 200880021733.6, Jun. 22, 2011.
The State Intellectual Property Office of the People's Republic of China, Notice on the First Office Action; Patent Application No. 200980108344.1, Jan. 21, 2012.
The State Intellectual Property Office of the People's Republic of China, Notice on Grant of Patent Right for Invention, Application No. 200880021733.6, Apr. 20, 2012.
The State Intellectual Property Office of the People's Republic of China, Notice on the First Office Action, Application No. 200980125925.6, Mar. 31, 2012, 8 pages, CN.
The State Intellectual Property Office of the People's Republic of China, Notice on the First Office Action, Application No. 200980118341.6, Feb. 17, 2013.
The State Intellectual Property Office of the People's Republic of China, Notice on the Second Office Action and Search Report, Patent Application No. 200980108344.1, Dec. 5, 2012.
The State Intellectual Property Office of the People's Republic of China, Notice on the Second Office Action, Application No. 200980125925.6, Feb. 25, 2013, 11 pages, CN.

(56) References Cited

OTHER PUBLICATIONS

The State Intellectual Property Office of the People's Republic of China, Notice on the First Office Action, Application No. 201080023851.8, Jul. 15, 2013, 8 pages, CN.
The State Intellectual Property Office of the People's Republic of China, Notice on the First Office Action, Application No. 201080032626.0, Jun. 28, 2013, 7 pages, CN.
The State Intellectual Property Office of the People's Republic of China, Notice on the Third Office Action, Application No. 200980125925.6, Nov. 5, 2013, 1 page.
The State Intellectual Property Office of the People's Republic of China, Notice on the Third Office Action; Patent Application No. 200980108344.1, Feb. 27, 2014, English Translation.
The State Intellectual Property Office of the People's Republic of China, Translated text of Notice on the Second Office Action; Patent Application No. 201080015842.4, Mar. 10, 2014.
The State Intellectual Property Office of the People's Republic of China, Notice on the Second Office Action; Patent Application No. 201080023851.8, Apr. 8, 2014.
The State Intellectual Property Office of the People's Republic of China, Notice on the Second Office Action; Patent Application No. 201080032626.0, Apr. 16, 2014.
The State Intellectual Property Office of the People's Republic of China, Text of the Third Office Action; Patent Application No. 201080015842.4, Sep. 5, 2014.
The State Intellectual Property Office of the People's Republic of China, Notice on the Fourth Office Action; Patent Application No. 200980108344.1, Jul. 25, 2014, English Translation.
The State Intellectual Property Office of the People's Republic of China, Fourth Office Action; Patent Application No. 200980108344.1, Dec. 29, 2014, Chinese.
Translated Text of the First Office Action for Application No. 201080015842.4, May 6, 2013, 6 pages, CN.
Translation of Office Action and Taiwan IPO Search Report, Taiwan Invention Patent Application No. 0977118130, May 31, 2013.
United States Patent & Trademark Office, Final Office Action, U.S. Appl. No. 12/121,260, Jan. 12, 2015.
United States Patent & Trademark Office, Final Office Action Summary, U.S. Appl. No. 12/391,817, dated Aug. 27, 2012.
United States Patent & Trademark Office, Non-Final Office Action Summary, U.S. Appl. No. 12/496,453, dated Jun. 13, 2012.
United States Patent & Trademark Office, Non-Final Office Action Summary, U.S. Appl. No. 14/073,986, dated Dec. 1, 2014.
United States Patent & Trademark Office, Non-Final Office Action, U.S. Appl. No. 12/466,306, dated Nov. 7, 2012.
United States Patent & Trademark Office, Non-Final Office Action, U.S. Appl. No. 13/260,893, Mar. 11, 2013.
Volkman et al., "Ink-jetted Silver/Copper Conductors for printed RFID Applications," Materials Research Society Magazine, 2004, vol. 814, 6 pages.
Wu et al., "One-Step Green Route to Narrowly Dispersed Copper Nanocrystals," Journal of Nanoparticle Research, 2006, pp. 965-969, 5 pages.
Yaniv, "Novel Inkettable Copper Ink Utilizing Processing Temperatures Under 100 Degrees C Without the Need of Inert Atmosphere", Presentation at Printed Electronics Europe Conference, pp. 1-25, Apr. 7-8, 2009, retrieved from internet Aug. 26, 2010.
Yeshchenko et al., "Size-Dependent Melting of Spherical Copper Nanoparticles," article published by National Taras Shevchenko Kyiv University, Jan. 2007, 16 pages.

\* cited by examiner

Evaporated platinum layer

Bubble in the PET film

PHOTOSINTERING OF MICRON-SIZED COPPER PARTICLES

This application claims priority to U.S. Provisional Patent Application Ser. No. 61/669,431, which is hereby incorporated by reference herein.

TECHNICAL FIELD

The present disclosure is directed towards metallic ink such as copper. Metallic conductors on printed circuit boards ("PCBs") and flex tape connectors are generally copper ("Cu") lines that are laminated to PCBs or polymeric substrates. These conductors are typically deposited by laminating copper films and etching the desired pattern. Patterning requires photolithography and acidic solutions that incur high costs and create environmental waste. An alternative technique to lamination and etching includes printing the metal lines. Described herein are materials and methods for providing cost effective micron-sized copper particle based inks, the printing and sintering of those inks to form electronic conduction layers on low temperature polymeric substrates.

BACKGROUND

Additive manufacturing is becoming a more accepted method to produce goods due to reduced stream of waste and increased material utilization efficiency. Electronic circuits are particularly able to realize the benefits of additive manufacturing using a direct printing method. Direct printing, of electronic circuits requires specialty inks made from metallic particles that can be easily applied with various printing methods. All printed metallic inks based on metal particles must be sintered to transition from individual particles in the stabilized ink formulation to a conductive film material suitable fir use in the end product.

Nanoparticle inks are utilized for the printed electronics industry. However, nanoparticles are expensive compared to larger, submicron and micron-sized particles. The use of these size particles is limited in applications such as electronic interconnects, membrane switch conduction layers, radio-frequency ID tags, displays and other applications due to the lack of suitable processing, procedures to convert the particles to a conductive film.

BRIEF DESCRIPTION OF THE DRAWINGS

FIG. 7 shows the image at a higher magnification.

DETAILED DESCRIPTION

Figure 1:
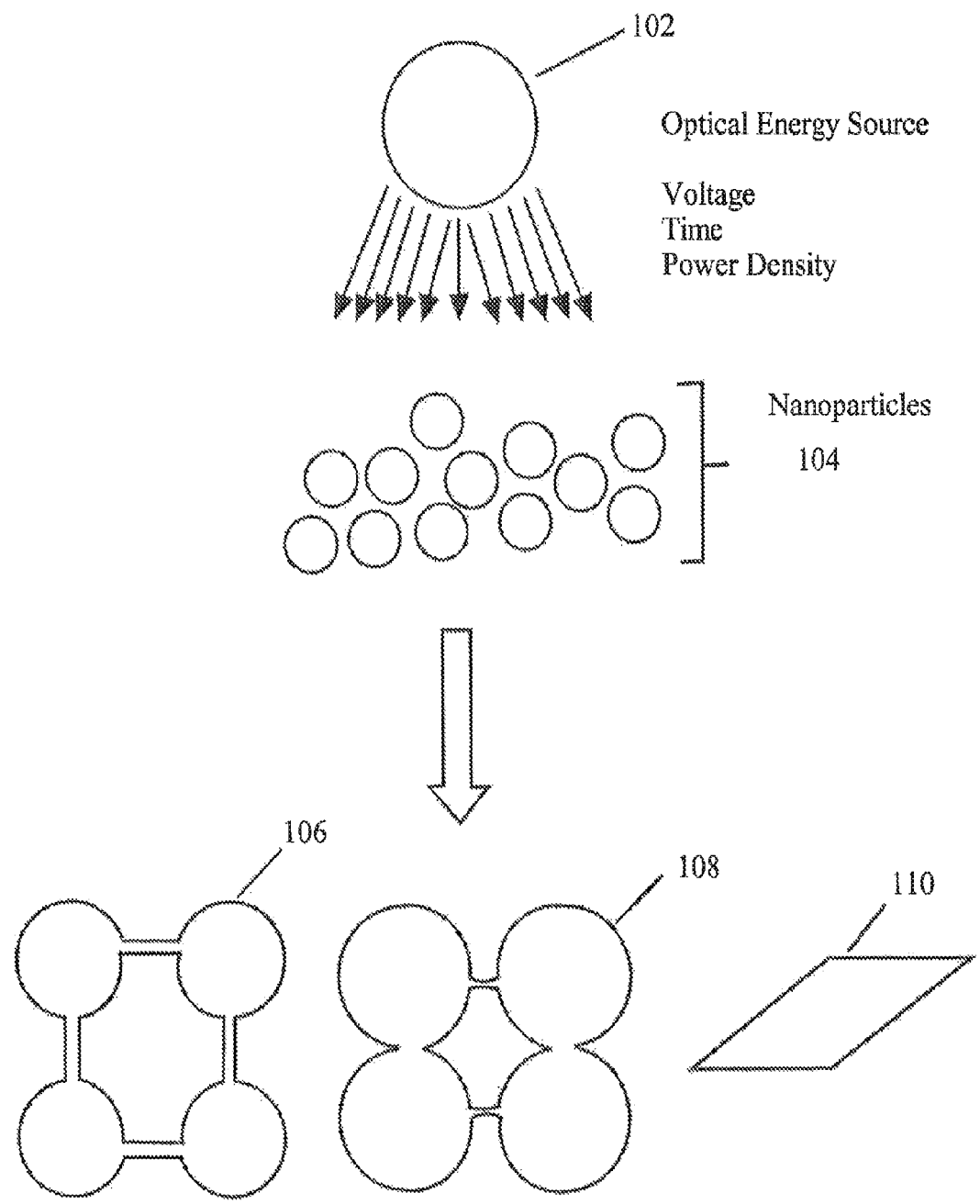
FIG. 1 illustrates formations of "necks" between particles in accordance with embodiments of the present invention.

An aspect of the present invention involves a method for making a conductive film comprising depositing an ink, or paste composition comprising micron-sized metal particles onto a polymeric substrate having, a melting point less than 200° C., wherein the micron-sized metal particles in the ink or paste composition have an average particle size greater than one micron, and photosintering the ink or paste composition after being deposited onto the substrate.

In another aspect of the present invention, the polymeric substrate may have a thermal conductivity greater than 0.1 W/mK. In another aspect of the present invention, the average particle size of the micron-sized metal particles in the ink or paste composition may be less than three microns. In another aspect of the present invention, the photosintering may be performed with a broad spectrum light source. In another aspect of the present invention, the melting point may be less than 150° C.

In another aspect of the present invention, the metal particles may copper. In another aspect of the present invention, the metal particles may be selected from the group consisting of Ag, Ni, Al, and Fe. In another aspect of the present invention, the polymeric substrate may be comprised of PET.

In another aspect of the present invention, the photosintered metal particles may be connected to each other with necks.

In another aspect of the present invention, the polymeric substrate may have a coefficient of thermal expansion greater than two times the coefficient of thermal expansion of the photosintered ink or paste composition. In another aspect of the present invention, the photosintering may cause some of the metal particles to become physically embedded into a surface of the polymeric substrate.

In another aspect of the present invention, the photosintered ink or paste composition may have a resulting resistivity less than $10^{-4}$ ohm-cm.

Additive electronics printing additionally enables high speed processes for application of the ink such as screen print, flexographic printing, gravure printing and inkjet printing. Each of these methods is compatible with roll to roll printing methods and polymeric substrates with low melting temperatures. Therefore, there is tremendous interest in developing capabilities to print conductors on various substrates using low temperature processes (e.g., <150° C.). Important applications for such processes include printing metallic conductors on substrates, such as paper, polyethylene terphthalate ("PET"), acrylonitrile butadiene styrene ("ABS"), polyimide, polycarbonate, polyacetates, polyvinyl chlorides, etc. Most of these types of substrates have a very low melting point that defines a maximum process temperature of 150° C. This limitation requires ink materials and methods to sinter them that do not exceed this maximum substrate temperature. There are different materials that allow for creation of metallic films from solution based processes. Below is a description of the different materials commonly used.

Metal Salts and Complexes:

This approach utilizes the ability of certain salts or oxides to decompose to form the base metal. The decomposition can be driven by thermally heating the material or using photo-processes. Examples for such materials are silver oxide, silver nitrate, formats and oxalates of nickel and copper, silver nitrate DMSO complex, etc. The nascent metals produced during decomposition of the parent compound is very reactive and tends to join to other newly formed metal clusters affording a continuous pattern. Commercial silver inks based on this phenomenon are available. These inks have difficulty in obtaining traces greater than one micron due to the dilute nature of the complex in the ink. The complex type ink may not be suitable for these pruned electronic applications due to the thickness limitations.

An interesting utilization of this phenomenon is presented in Japanese patent publication 4666663, which makes use of silver salt-coated micron-sized copper particles. When the silver salt-coated particles are heated, the silver salt yields silver metal, which assists the sintering of adjacent particles and even allows sintering of the copper cores. Silver metal-coated copper particles are well known in the art and are commercially available from numerous producers, such as Ferro. The patent above clearly does not employ this kind of system.

Using Alloys:

This approach utilizes the ability of different metals to form alloys with other metals. This process can involve reduction of melting point at the contact areas between the two or more metals. It also involves dissolution and mixing of the metals into one another. In this context, there is a place to mention U.S. Published Patent Application No. 2008/0160309, which describes ternary and quaternary alloys involving nickel, bismuth, tin, and silver. A binary system of silver-coated copper particles was tested and could be thermally sintered at 700° C. for 10 minutes under nitrogen (see. D. S. Jung et al., Journal of Colloid and Interface Science 364 (2011) 574-581, which is hereby incorporated by reference herein). Such conditions are not suitable for printing on plastic materials or paper.

Most currently employed ink and paste materials involve silver particles. These particles are relatively very expensive to produce or purchase due to the market price of the metal, such as in silver, and due to the fabrication processes required to synthesize the nano-sized particles. Generally, for a given metal, the smaller the particles, the more expensive they will be. Often this increased price prevents them from being widely used in mass manufacturing processes. Therefore, there is a genuine need to find cheaper replacements for the nano-sized silver and copper. To clarify the definition of "nano-sized," the classical definition is used wherein dimensions less than 100 nanometers are considered nano-sized. It is also known that particles of a certain batch have certain distributions of particle diameters within the batch.

Copper is a metal of choice for making electrical conductors. It is second only to silver in conductivity, relatively inexpensive, and is chemically resistant thus allowing further treatments such as soldering other metals to it. The assignee has successfully demonstrated photosintering of nano-sized copper particles using a photosintering process. The rational in this system lies in the higher reactivity and lower melting points of nano-sized metals.

To make inks from copper requires small particles that are compatible with the type of printing. For example, inkjet printing may require smaller particle diameter such that the particles will not clog the nozzle that is typically a few microns in diameter. The particles are typically required to be 1/10th the size of the nozzle diameter to prevent clogging. Screen printed inks must have particles small enough to prevent clogging in the screen mesh.

Unfortunately, copper nanoparticles do not realize the ease of processing required for widespread usage in metallic ink materials. For example, comparative cost savings of nanoparticles to their bulk metal counterparts is not maintained. The current market for copper is approximately 200 times less expensive than silver. However, copper nanoparticles are usually almost as expensive to produce or purchase as silver nanoparticles. The manufacturing process to control the particle size is considerably more expensive than the raw material costs. Micron-sized particles can be milled down from bulk metals with a considerable reduction in cost due to the economy of scale from producing large quantities in a single process batch.

Copper nanoparticles tend to oxidize very quickly due to their high surface area. The oxide coating is an electrical insulator, making them difficult to convert into conductive films unless there is suitable protection from oxidation or a method to convert the oxide by chemical reduction back to copper.

A process to convert the individual nanoparticles in the ink to a conductive film requires sufficient energy to melt the nanoparticles. The amount of energy depends on the size of the metal particles. The process can result in necking between adjacent particles through full melting where there is a complete transformation to a bulk material with minimal voids and maximum density. The process parameters will change based on the melting point of the particles, the amount of energy put into the system to melt the particles and the dwell time of energy delivery that controls how much melting takes place.

Discussion on Particle Melting Points

Due to quantum confinement, the melting point of a small particle drops as a function of particle diameter. The smaller the particle, the lower the melting point compared to a bulk metal part. Nanoparticles of metal can have melting points hundreds of degrees lower than the bulk metal melting point. Lindemann's Criterion states that the melting point of a material is proportional to the cohesive energy of the particles. Each metal atom in a metallic particle has energetic interactions with its neighboring atoms. The atoms at the surface have fewer neighboring atoms and reduced cohesive energy compared to the energy of the atoms in the center. Because the energy of the particles depends on distance from the surface, very small particles with small diameters, nanoparticles in particular, can have reduced cohesive energy resulting in overall reduced melting points. The file size dependent melting point follows the Gibbs-Thomson Equation:

$$T_M(d)=T_{MB}(1-[4\sigma_{sl}/H_f \rho_s d])$$

where $T_M(d)$ is the calculated melting point as a function of diameter, $T_{MB}$ is the bulk melting point of the parent metal, $\sigma_{sl}$ is the interface energy of the solid to liquid interface, $H_f$ is the bulk heat of fusion, $\rho_s$ is tho density of the parent metal, and d is the particle diameter. The l/d dependence clearly shows that as the diameter is reduced, the melting point is reduced.

There are several mechanisms related to small particle melting. The liquid nucleation ("LSN") model proposed by Sakai (H. Sakai, "Surface-induced melting of small particles," Surf. Sci. 351: 285 (1996)) closely fits the experimental measurements. LSN predicts that the surface of a particle will melt initially and provide enough energy, and a liquid-solid interlace will propagate from the surface of the particle down through the center of the particle. LSN thus calculates the difference in energy potential between the energy potential of the liquid surface atoms and the solid core atoms. The equilibrium established between these two energy potentials is a function of the internal energy, the overall temperature, the system entropy and the specific number of particles at a given chemical potential, and is related to the first and second Thermodynamic Laws.

Discussion on Energy Delivery

The melting of particles is completed with energy delivery that has a finite time component. This provides a kinetic term to the thermodynamic discussion. The kinetics of the system describe how much energy stays in the nanoparticles and is a function of energy flux (delivery to the particles), energy interactions within the particles related to melting mechanisms, and energy dissipation to the substrate and surrounding atmosphere.

Thermal sintering is completed with ovens, infrared sources, heat lamps, or other heat delivery systems that transfer heat energy into a substrate and ink. The temperature is typically set to the minimum melting point required to convert the particles into a film. With thermal sintering of particles, the energy delivery is typically slow. High temperatures that exceed the melting temperature of the particles and long dwell times are required. The long dwell times can range from approximately one minute to greater than 60 minutes, and are required such that the substrate and particles are in temperature equilibrium and overcome the kinetics of the particles melting. The kinetics of melting are related specifically to the individual particles, solid-liquid transition and rearranging themselves to flow into their nearest neighbors to form a bulk conductor. Often, due to the energy levels being slightly above the melting point and through a distribution in particle size, the melt transitions suffer from low kinetics. Surface oxides on the articles will also change the surface energy of individual particles slowing down or preventing coalescence into neighboring particles.

Photosintering with light has different kinetics. The light source may be a broad spectrum source, such as a flash lamp source (e.g., a xenon arc flash lamp), which may have an output ranging from the UV (~250 nm) to the IR (~800 nm) (see FIG. 3). Photosintering may be completed with a steady state or pulsed light delivery. A steady state light delivery may be rastered or scanned such that the dwell time in a particular location is short.

The photosintering process involves illuminating the particles with a flashlamp so that the particles absorb the energy and present reactivity based on two mechanisms. The first mechanism is creation of high temperatures in the particle fir very short times. The flash lamp can deliver large amounts of energy in short time periods (e.g., greater than 1800 Joules of energy can be delivered in as short as 0.2 milliseconds). The output spectrum of the lamp may have an overlap with the absorbance spectrum of the particles. The output intensity of the lamp may be controlled by the lamp voltage. The duration of the pulse delivery may be controlled through the lamp flash pulse width. Each of these parameters may be independently adjustable within the total power delivery specifications of the power supply connected to the lamp assembly. As the particles absorb the energy, they internally convert it to heat as a mechanism to dissipate the energy. If the energy delivery is large enough and fast enough, the particles convert the absorbed light to heat faster than they can dissipate the energy. In this case, the internal temperature of the particles is increased and the result can be melting. The second mechanism is unique to photosintering in that the surface oxide on the metallic particle can be reduced or even removed from the surface. This photoreduction step and subsequent removal of surface oxides, changes the surface tension of the metal particles, allowing the melted surfaces to flow into its nearest neighbors creating a connection between particles. If the energy delivery is large enough and fast enough, the particles will first neck together, followed by shape reorganization into a dense film.

In most cases, the substrate on which the particles have been deposited has minimal absorbance spectrum overlap. Having differential absorbance spectra of the particles and the substrates allows for selective heating of the different layers. This selective heating cannot be accomplished with thermal heating, methods. Using this mechanism, it is possible to photosinter particles with high melting points onto substrates with low melting points. Examples of substrates include paper, polyethylene terphthalate ("PET"), acrylonitrile butadiene styrene ("ABS"), polyimide, polycarbonate, polyacetates, polyvinyl chlorides, cyclo-olephins, and polyimide.

Discussion on Substrates

The choice of substrate can determine the quality of adhesion and conductivity of the metallic film that is created by conversion of the particles to the conductive metallic film. There are three key parameters that control the amount of energy dissipation during the process; the thermal conductivity, the melting point, and the coefficient of thermal expansion of the substrate. The CTE value, thermal conductivity, and melting points of copper and various polymeric materials are listed in Table 1.

TABLE 1

| Material | CTE (µm/m K) | Thermal Conductivity (W/mK) | Melting Point (° C.) |
|---|---|---|---|
| Copper | 18.7 (16.7 ppm/° C.) | 385 | 1760 |
| PET | 59.4 | 0.15 | 115-170 |
| Polyvinyl Chloride (PVC) | 50.4 | 0.12 | 50-75 |
| Polycarbonate (PC) | 70.2 | 0.19 | 115-130 |
| Poly Styrene (PS) | 70 | 0.10-0.13 | 50-95 |
| Polyethylene (PE) | 200 | 0.33 | 55-120 |
| Polypropylene (PP) | 100-200 | 0.17 | 90-120 |
| Epoxy | 49 | 0.2-5 | |
| Polyimide (30-100° C.) | 17 | 0.10 | 425 |
| ABS | 80 | 0.17 | 70-100 |

Because of the differences in CTE, thermal conductivity, and melting point, there are many limitations to converting metallic particles into conducting films on many substrates. In fact, it is difficult to deposit copper on many low temperature substrates such as PET and PC, because the adhesion is often poor and the process has a very narrow window. Nanoparticle-based inks and particle interactions with the substrate during photosintering are typically dominated by CTE and surface tension during melting. These are approximations based on the resulting film of a high density bulk metal placed upon a comparatively low density substrate material. Larger particle (i.e., diameters from 100 nm up to 3 microns) interactions with the substrates during photosintering are typically dominated by melting point and thermal conductivity. Due to the metallic film morphology generated by the larger particles, the CTE mismatch between the metallic film and the substrate is less critical.

Thermal conductivity of the substrate dominates the energy transfer mechanisms during photosintering. The temporal temperature change of the particles creates a temperature gradient from the top of the metallic particle coating to the substrate. The face of the particle film facing the light source will have the highest temperature based on the greatest photon flux and light absorbance. The face of the particle fill that is furthest from the light source, which is also the interface between the particles and the substrate, will have the lowest temperature as the substrate's thermal conductivity wilt begin to remove the heat of the metallic film. Low thermal conductivity substrates such as polyimide absorb little heat from the metal particles as they undergo the photosintering process. Substrates such as polycarbonate ("PC") or polyethylene terephthalate ("PET") have higher thermal conductivity and can require additional energy to overcome the heat loss between the particles and the underlying substrate.

A challenge with photosintering is the time scale of energy delivery. Delivering 1500-1800 Joules of energy in millisecond time scales means the temperature ramp rates are exceedingly steep. Generally, this can be considered a violent process due to the rate of change of the energy in the metallic particles. If the energy delivery is too fast, the particles can ablate from the surface as they gain energy faster than they can dissipate through mechanisms related to phase transitions (solid to liquid and liquid to solid) and thermal transfer (convection, radiation, and conduction).

The melting point of the substrates can determine the applicability between thermal and photosintering. Higher process temperatures are required for some nanoparticle systems. For example an 80 nm copper nanoparticle film will have a thermal melting temperature of approximately 400° C. Partial melting of the film due to the smaller particles in the particle size distribution will begin to melt as low as 300° C. These temperatures allow polyimide to be chosen as a substrate for thermal sintering. However, many other polymeric substrates are not compatible with this melting point in that such polymeric substrates would melt before the particles.

Many of the polymeric substrates melt at temperatures below 120° C. PET is a common plastic used in the industry as it has a melting temperature higher than other materials with a working temperature up to 150° C. This allows it to be compatible with certain thermal sintering processes that involve nanoparticles smaller than 30 nm, preferably below 20 nm. Silver nanoparticles are commonly available in this size. Copper nanoparticles can be manufactured in this size and will have a similar low melting point. However, the copper nanoparticles are more difficult to keep from oxidizing at this size.

The coefficient of thermal expansion ("CTE") value for metal and plastic based materials determines how much dimensional change occurs as a function of temperature. When multiple layers of different materials are stacked, it is important to consider matching the CTEs of the materials. Without CTE matching, one film may change dimensions at a faster rate than the other under temperature changes, which can cause delamination and problems with adhesion. Placing a metal film onto a plastic substrate demonstrates many problems with adhesion due to mismatches in cm. The loss of adhesion comes from lateral stresses in the film. For example, if copper (CTE=18.7) is deposited onto as PET substrate (CTE=59.4), the PET substrate will enlarge at a dimension greater than three times that of the copper. This differential in dimensions creates lateral stresses in the PET substrate. The metallic film forms a material continuum. The PET substrate will begin to buckle as the internal forces on the metallic film are stronger than the interfacial forces between the copper and polymer. In this example, the buckling creates a force normal to the surface. With sufficient temperature, the forces can be great enough to cause film delamination.

The same mismatch of CTE also causes problems on cooling. For example, during thermal sintering, the particles are heated at the same time as the substrate. The particles are then converted to a melted metal film while the substrate is hot. When the substrate is cooled down, the metallic film solidifies before the plastic cools. As the plastic continues to cool, it shrinks at a greater rate than the metallic film, which also creates stress that can delaminate the film.

If the CTE of the metallic film can be matched to the substrate, the stress between the substrate and metallic film will be minimized. Alternatively, the stress can be relieved by increasing the degrees of freedom within the metallic film. While it is difficult to engineer stress reliefs into the metallic film, this can be done in situ with the sintering by controlling the porosity and defects in the metallic film. Defects and/or voids can be places for stress release in the metallic film. A highly porous film can have less stress then a highly dense film. The density can have a lower limits described by the closest packing of the individual particles and specifically as function of the particle diameter and have an upper limit of a pure bulk material. Typically, thermal sintering of particles will have an upper limit of around 5-10% porosity due to the long dwell time of the heat application. This acts as a continuous metallic film.

In contrast to a continuous metallic film, a highly porous metallic film can be made by connected or necked metallic particles. Particle necking occurs when the surface of a single particle melts but the melt transition does not propagate through to the core of the particle. The melt phase on the surface then flows to one or more neighboring particles such that interparticle connection is established. If the energy input delivery is maintained, the particles will continue to transition from surface melting to core melting and have flow into as continuous film. If the energy input delivery is removed, the particles can solidify with just a connecting neck between them. The interparticle necking is responsible fur film conductivity, and in some cases adhesion properties to different substrates. Such necking is further discussed in U.S. Pat. No. 8,422,197, which is hereby incorporated by reference herein.

There are a few mechanisms related to improving the energy input relationship with the adhesion. If the energy input overwhelms the mechanisms of energy dissipation, there can be ablation. There are two ways to change the kinetics of the energy dissipation: increase the mass of the particles to be convened to a film and/or slow down the energy input such that the dissipation can keep up.

Increasing the mass of the particles changes the kinetics related to the behavior of the particles in reactions and physical transformations. The volume of the particles and thus the density is a cubed power function related to particle diameter. Nanoparticles are well known for their small mass and high mass/volume ratios. This is an advantage fur photosintering as the small volume requires less energy to complete the solid to liquid (melt) phase transition. However, if larger particles are used, there is more mass per particle. The increased mass changes the latent heat of phase transition requirements meaning for the same heat capacity, as a function of mass, it takes more energy to complete the melt transition. If there is a finite energy delivery, as is the case with photosintering, the particles may or may not have enough energy to complete a full melt transition. One can tailor the energy delivery through the pulse width and lamp voltage such that control is possible between a surface melt and necking all the way through a Inn melt transition into a continuous metallic film. It is also possible to decrease the lamp voltage and increase the pulse width of the lamp flash. This lowers the intensity and increases the duration changing the effective energy delivery.

Increasing the mass of the particles is a direct result of larger diameter. When the diameter of the particles is increased, the optical spectrum shifts. Nanoparticles have large absorbance spectra extinction coefficients at nearly every wavelength in the spectrum. As a result, they often appear black in color when the size is below 200 nm. As the particle diameter is increased, the energy of the particle is decreased, and there is less absorbance in the lower wavelengths. For example, with respect to copper particles, at sires greater than 500 nm, the absorbance is reduced at typically greater than a wavelength 550 nm giving them a reddish copper color (see FIG. 2). During a photosintering process, less total light is absorbed by these larger particles due to the lack of overlap between the output spectra of the light source and the particles.

Increasing the mass can also change the particle inertia. Often the process of photosintering can ablate material from the surface. Nanoparticles are especially susceptible to material ablation as there is minimal mass to prevent the motion-based energy dissipation. In contrast, larger particles have greater mass and therefore are resistant to ablation.

There is a finite range of particle sizes where the particles are large enough to resist ablation yet small enough to show some melting during the photosintering process. The size range for copper particles required for formation of surface melting during photosintering and subsequent necking between adjacent particles is greater than 0.5 microns and larger than 3 microns. The smaller particles in this size range absorb considerably more energy and will completely melt. The larger particles outside this size range have too much mass and will not transition to a surface melt phase that creates necking (see FIG. 8). The particles within this range can exhibit a degree of surface melting such that a connection to a neighboring particle is established during photosintering. Controlling the distribution of particle size can tune the degree of necking thereby influencing the degrees of freedom of the metallic film and thus the adhesion to various substrates where CTE mismatch occurs. The degree of necking also controls the overall resistivity of the resulting metallic film. This partial transition can be seen with thermal sintering of copper particles in the size range required for necking to develop. There are multiple particles that are necked together when sintered thermally at 800° C. This experiment was completed on a high temperature silicon substrate as polymeric substrates would have melted. The photosintering process produced more necking and lower resistivity in a shorter time scale (see FIG. 9).

Necking of particles is advantageous for reducing interfilm stress. The stress relief allows for more energy to be transferred into the underlying substrate. In this case, when the thermal conductivity of the substrate is high, the particles can transfer more heat into the substrate controlling their temperature ramp rate. In some cases, when the thermal conductivity of the substrate is high, and the melting point of the substrate is low, larger particles can transfer enough heat to dissipate energy, create necking between adjacent particles, and partially melt the underlying substrate. This partial melting of the substrate allows for particle embedding such that adhesion is increased (see FIGS. 6-7). When the particles are at the large end of the size limit (i.e., diameter greater than 2 microns), the particles can have enough mass to sink into the partially melted polymeric substrate providing a strong anchoring point, resulting in excellent adhesion. This is evidenced by the excellent adhesion of micron-sized particles to most low temperature substrate materials listed in Table 1.

The inventors have previously developed copper ink formulations based on metallic nanoparticles. These metallic nanoparticles may be made from Ni, Al, Cu, Ag, Fe, or other similar metals or alloys of metals as described above.

Disclosed are novel techniques for forming conductive copper patterns using formulations containing micron-sized copper particles. These copper particles may be joined together by a photosintering method. Embodiments disclosed herein describe how micron-sized copper particles may be photosintered to yield films and patterns of copper on different substrates such as polyethylene terephthalate ("PET"), epoxy-glass fiber primed circuit board ("PCB") substrates, and polyethylene ("PE"). The films show good adhesion and conductivity.

Embodiments of the present invention achieve successful photosintering, of micron-sized copper particles to obtain conductive patterns that adhere to PET substrates, as well as other substrates. Embodiments of the present invention further achieve addition of a polymeric binder (vehicle) to affect film properties (i.e., improve adhesion and prevent excessive photosintering, which may lead to blowing away of the copper film).

There are several factors that can change the resistivity of conducting films. The copper particles can vary in outer diameters and thicknesses of the surface oxides. The particles can also vary in the overall shapes of the particles. Particles can be spheroidal in overall shape, but not be considered spherical. Spherical particles are significantly round in shape having nearly identical dimensions in the X, Y, and Z axes. Spheroidal particles have a round profile when viewed from a distance, but have other increased order shapes when viewed in detail.

The shape of the particles dictates the amount of energy required to change this shape. For example, a perfectly spherical particle is very stable, and resides at a minimal energy point on its potential energy curve, it will require a significant amount of energy to move away from this stable shape and connect with a neighboring particle to form a conductive pathway. Particles that have an otherwise smooth surface but non-spherical (oblong, oval, egg shaped, etc.) have a higher potential energy due to an increased dimension in one or more of the ages. The higher potential energy of these particles increases the difficulty for each to form "necking" connections (joining of particles where each of the parent particles remain easily distinguishable from one another) with its neighboring particle. If a non-spherical particle had rough edges, such as sharp corners, bumps, or other protrusions, the particle would have higher potential energy than the standard non-spheroidal particles, and significantly higher than the spherical particles.

The shapes of the particles can also shift the optical absorbance spectrum of the particles. The optical absorbance spectrum is important when considering utilizing a photosintering process. The light output wavelength of the light source should overlap with an optical absorbance of the particles. The greater the total energy of overlap, the greater the amount of energy the particles absorb. The energy of absorbance contributes to photochemical reactions (e.g., photoreduction of metal oxides in the particles) and the total heat conversion of light within the particles.

Consistent with the photosintering process, the surface of the particle melts but the bulk of the particle does not. When the surface of the particle melts and this melted surface is sufficiently near a neighboring particle that also has surface melting, the two melted surfaces flow together. When this occurs, a "neck" forms between the neighboring particles. However, even though these particles are now connected, they still retain their individual shape and can be clearly identified as connected, yet individual particles (see FIG. 1).

Figure 2:
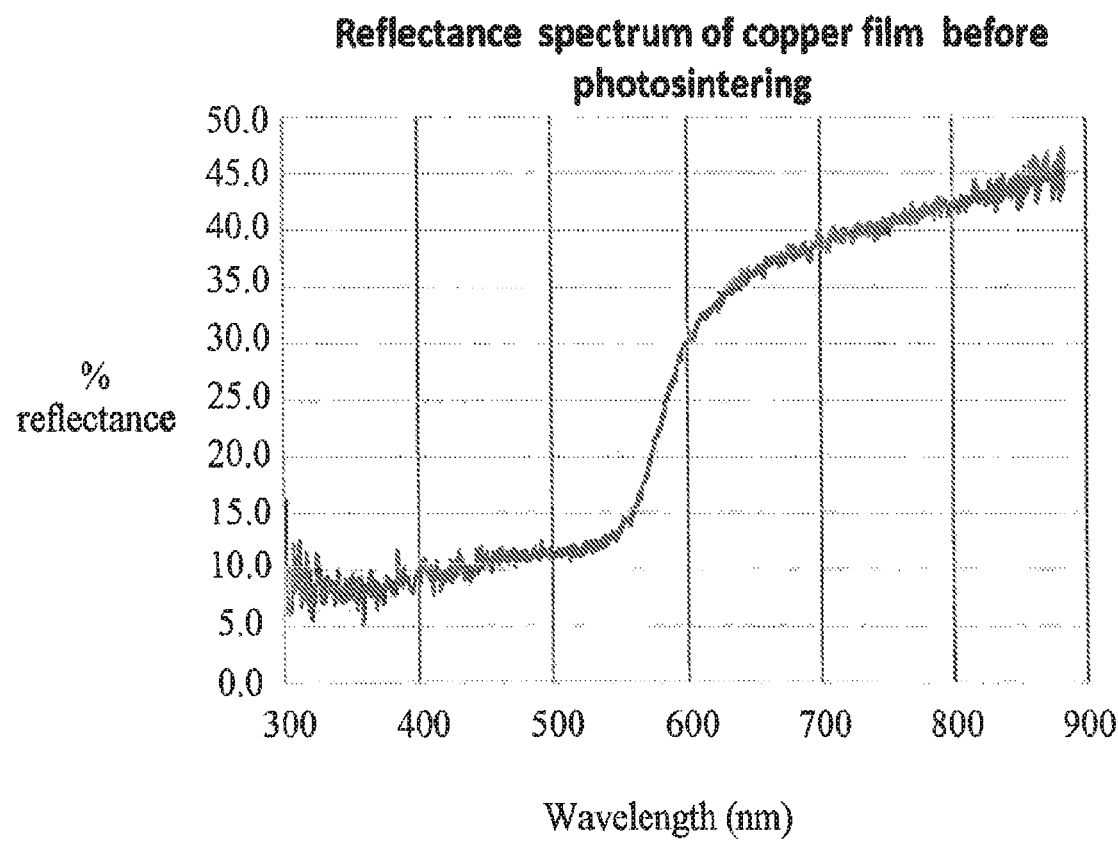
FIG. 2 illustrates a reflectance spectrum of copper particle film before photosintering.

FIG. 2 shows a reflectance spectrum of a copper particle film. The strong reflectance above 600 nm is representative of the reddish-brown color of the copper film. There is low reflectivity below 600 nm. This represents where the copper particle film absorbs light.

Figure 3:
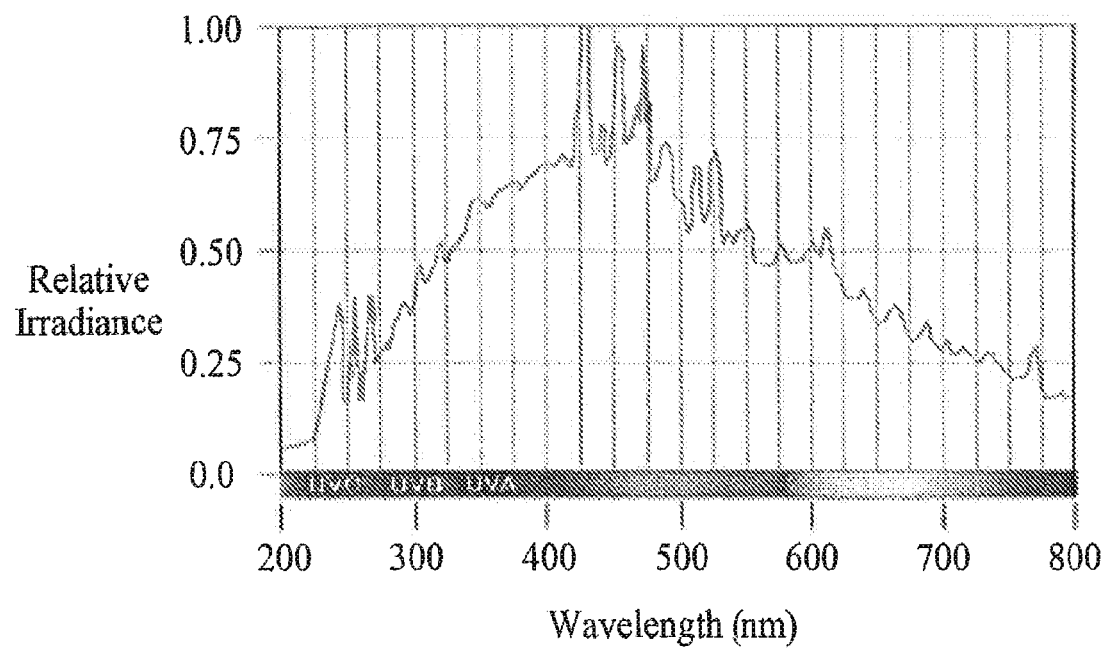
FIG. 3 illustrates an output spectrum from a Xe-arc discharge lamp used in a photosintering process.

The output spectra of a Xe-arc discharge lamp is shown in FIG. 3. This lamp is a type used in embodiments of the photosintering process described as used herein. Notice the significant light energy output from 300 nm to 700 nm with a peak output of 450 nm. The lamp has significant output energy that overlaps with the absorbance spectrum of the copper particle film. In fact, the majority of the output energy is between 350 nm and 550 nm. The absorbance overlap is also at the higher energy side of the visible spectrum. This higher energy is required for the larger micron-sized particles.

Embodiments of the present invention use micron-sized copper particles to successfully achieve stable, conductive films and patterns on PET substrates using processes described herein.

Referring to Table 2, paste, or ink, formulations were made using approximately 1 micron-sized copper particles. The particles' size distribution did not contain particles having diameters less than approximately 0.3 micron. A binder was approximately a 10% solution of ethyl cellulose as shown in Table 2. Films were drawn down on PET substrates (or may be printed using a screen printer). The films were dried (e.g., in an oven at approximately 100° C. for 30 minutes). Photosintering of the films used a pulsed light system (e.g., commercially available from Sinteron 2000, Xenon Corp.).

Electrical measurements were performed (e.g., using a four points probe). Adhesion was checked (e.g., by applying 3M "Magic" tape on the top of the photosintered copper film, pressing the tape from above with an erasure to ensure contact between the tape and the film, then peeling off the tape). Good adhesion is indicated when only traces of material stick to the tape. Poor adhesion is indicated when essentially the whole film is peeled away with the tape from the PET substrate.

Table 2 shows two examples of copper paste formulations. Formulation 2 contained a higher concentration of copper particles.

TABLE 2

| Material | Formulation 1 Concentration wt % | Formulation 2 Concentration wt % |
|---|---|---|
| Copper particles | 50 | 65 |
| 7% binder solution | 48 | 33 |
| Dispersant | 2 | 2 |
| Total % | 100 | 100 |

TABLE 3

| | Formulation 1 | Formulation 2 |
|---|---|---|
| Before photosintering | | |
| Layer thickness (μm) | 3 | 3 |
| Sheet resistance | Non-conductive | Non-conductive |
| Adhesion | None | None |
| After photosintering at 2.5 kV | | |
| Sheet resistance (ohm-square) | 0.20 | 0.04 |
| Resistivity (ohm-cm) | $6.0 \times 10^{-5}$ | $1.2 \times 10^{-5}$ |
| Adhesion | Good | Poor |

Both pastes were printed, on PET substrates and photosintered. Table 3 summarizes the results. Both formulations were not conductive (sheet resistance >10 kohm-square) and did not adhere to the PET substrate. After photosintering, both formulations produced conductive films. Films of Formulation 2 showed higher conductivity, but the films were fragile and did not adhere to the PET substrate as well as Formulation 1. On the other hand, photosintered films made with Formulation 1 showed good adhesion to the PET substrate.

Figure 4:
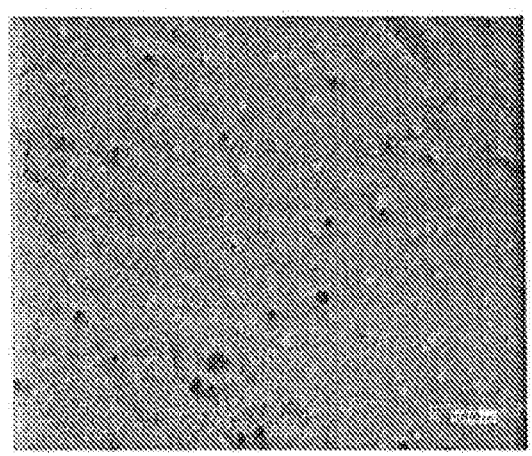
FIG. 4 shows an optic microscope image of a photosintered copper film on PET.

Visual inspection of the samples showed that the top surface of the PET substrate partially melted and copper particles were embedded inside such surface. This effect was far more pronounced in films made with Formulation 1 than films made with Formulation 2. This observation indicated that the binder assists to affix the copper particles in place during photosintering and allows the hot particles to partially melt the PET substrate surface and trench themselves inside such top surface. Moreover, copper has a high thermal expansion coefficient relative to PET. Therefore, the photosintered film shows a certain degree of shrinkage and stress at the PET-copper film interface. This results in microscopic cracks in the copper film as shown in FIG. 4. Overall, it is desired to reach a balance for achieving as much photosintering to ensure high conductivity, yet avoiding too much photosintering that results in a highly stressed and brittle film.

The ethyl cellulose binder may be replaced or mixed with other binders such as acrylic, polyurethanes, and even an UV-curable hinder capable of forming a cross-linked matrix. Binders that have high absorbance in the UV or visible light ranges and affect the energy that can be absorbed by the film may also be used.

Figure 5:
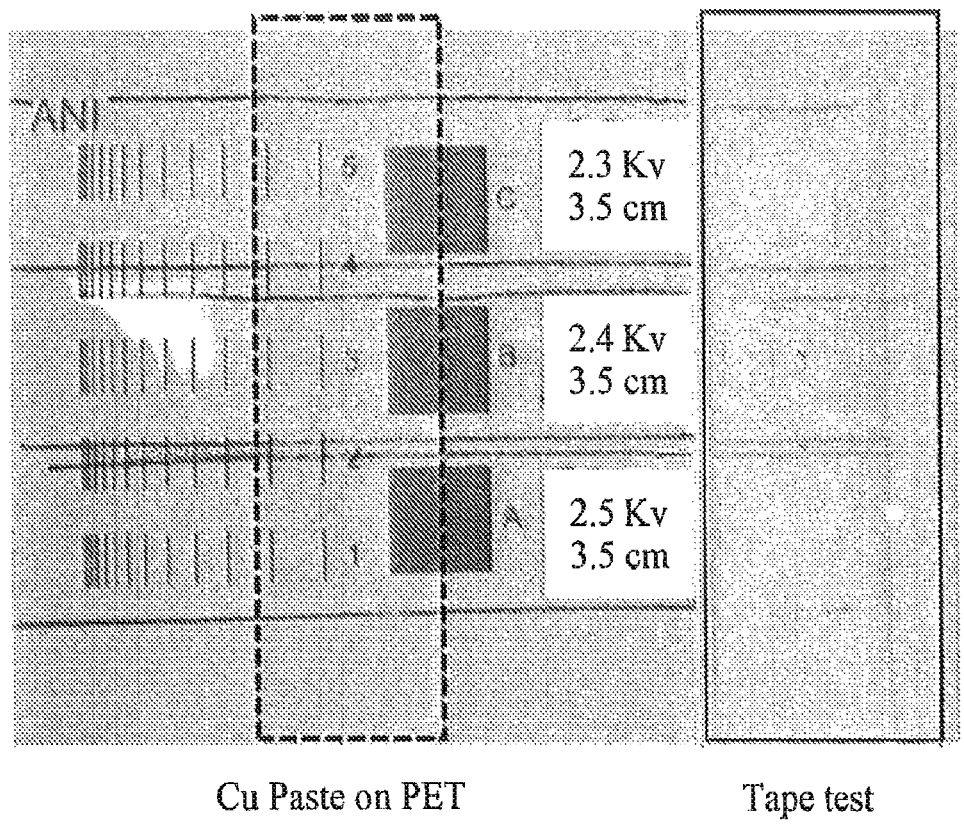
FIG. 5 shows a digital photograph of photosintered copper film deposited on a PET substrate. The tape used for checking adhesion is shown on the right. Dashed rectangle indicates the area where the tape was applied.

FIG. 5 shows a sample of Formulation 1 photosintered on a PET substrate. The tape used for testing adhesion is shown as well. The dashed rectangle indicates the area where the tape was applied. The tape is essentially clean.

Figure 6:
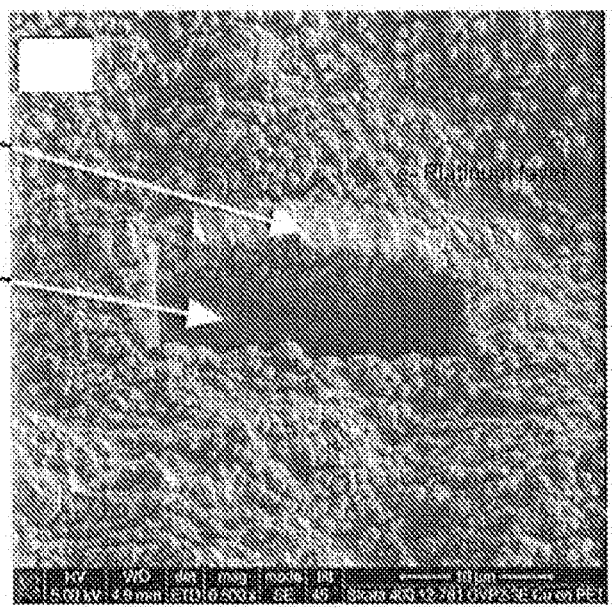
FIGS. 6-7 show a SEM-FIB of photosintered copper film on a PET substrate, where
Figure 7:
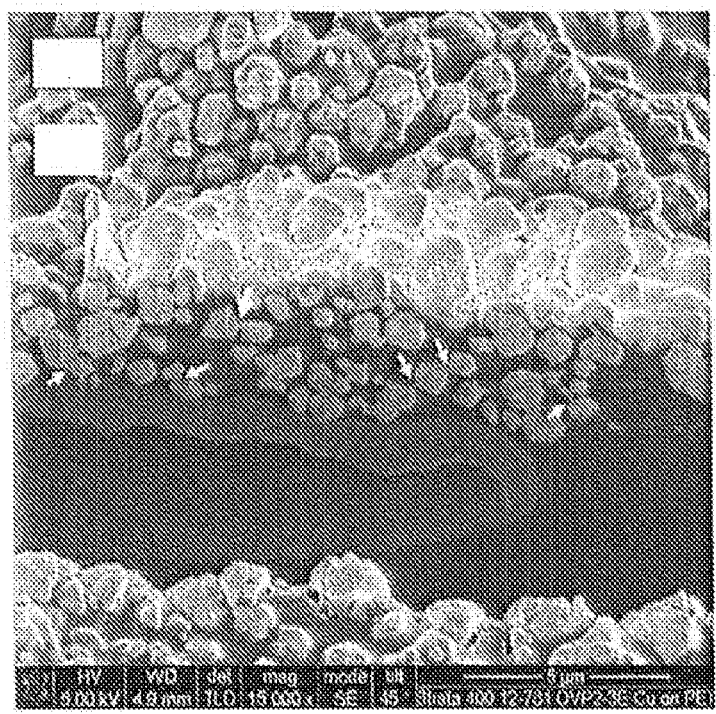

Scanning Electron Microscopy ("SEM") Results:

FIGS. 6 and 7 are SEM photographs of a photosintered film (~3 μm) on a PET substrate. The rectangular hole in the sample was created using a focused ion beam ("FIB") in order to obtain a cross-section of the layer. The SEM photographs show the copper particles embedded in the binder, and also show the particles still retain their original structure, characterized by the sharp corners. The FIB cross-section reveals that some particles are connected by thin necks. FIG. 7 is at a higher magnification showing "necking" between particles, as indicated by the white arrows. These necks are the results of photosintering and allow the film to become conductive.

Figure 8:
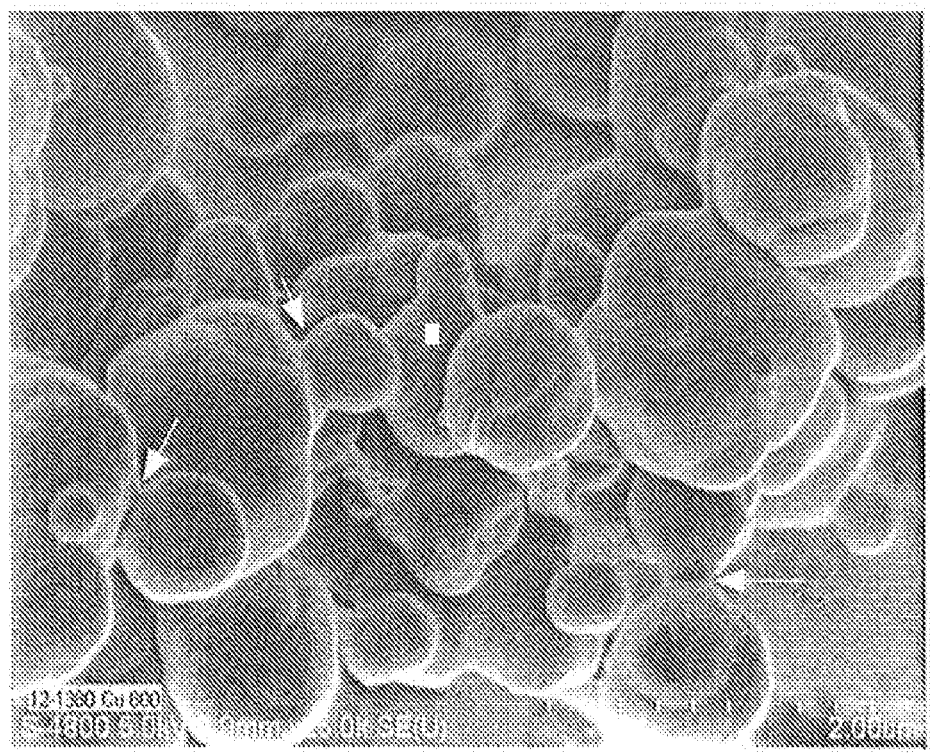
FIG. 8 shows a SEM photograph of copper particles on an alumina substrate after sintering at 800° C. for 30 minutes under $N_2/H_2$ environment. Arrows show necks.

Thermal vs. Photosintering:

Similar films were printed, on alumina substrates and subjected to merely thermal sintering. FIG. 8 shows an SEM photograph of such a film processed after 30 minutes at 800° C. in a $N_2/H_2$ environment. Under these conditions, the binder was burned away, and the particles were annealed and more rounded. Necks were observed as well.

Figure 9:
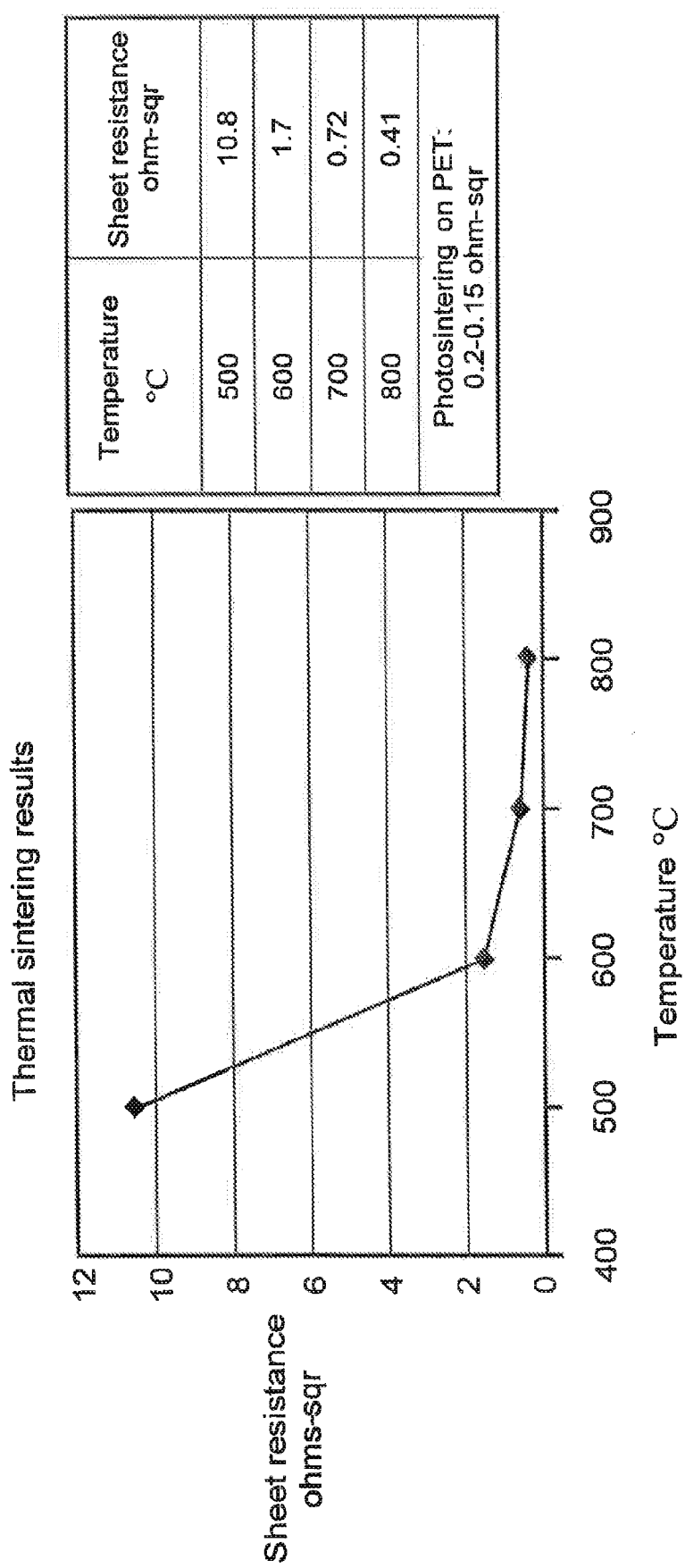
FIG. 9 illustrates a graph and table showing sheet resistance as a function of thermal sintering at different temperatures, with a comparison to photosintering.

FIG. 9 shows both a graph and table of the electrical conductivity results of thermal sintering at various temperatures compared to photosintering results. Conductivity increases (i.e., sheet resistance decreases) as the sintering temperature increases, yet even thermal sintering at 800° C. for 30 minutes could not achieve the conductivity reached using a few milliseconds of a photosintering light pulse (0.20-0.15 ohm-sqr).

The photochemical processes in photosintering allow decomposition of copper oxides to copper metal. The pulsed energy of photosintering enables the copper particles to momentarily reach high temperatures together with photo-reduction of surface oxides. This combined mechanism leads to effective photosintering of the copper particles. The photosintering process is creating a high density of necking between the copper particles in the case of photosintering vis-a-vis thermal sintering. Photosintering achieves lower resistivity than thermal sintering. The necking density (number of necks per volume of particles) in the photosintering processes was observed to always be higher than the necking density achieved in the thermal sintering processes. Although the thermal sintering occurs in forming gas, one needs to assume that originally a copper particle has a layer of copper oxide on its surface. The thermal process (even in a forming gas, reducing environment) does not remove the copper oxide layer, and thus even if necking between copper particles is achieved, the necking resistance due to the copper oxide presence is higher than the pure copper necking obtained during the thermal sintering.

The surface morphology of the copper particles after photosintering shows sharp or rough edges and non-spherical shapes. The process is fast such that the surface does not have enough time to truly melt and reorganize its shape. The energy could be transferred into creating necks with nearest neighbors rather than inter-particle reorganization. The surface morphology of the copper particles after thermal sintering shows highly spherical shapes with smooth surface features. This smoothness supports a surface melting phenomena whereby a "skin" of surface oxide is controlling the particle shape.

The thermal sintering process takes a significantly long time. Experiments showed a process time of approximately 30 minutes to achieve conductive films. With thermal sintering, the oxide conversion due to chemical reduction with the forming gas environment is a slow process. This slow process greatly limits the number of necks achieved between particles and raises the resultant resistivity of the film.

Photosintering is a fast process. The photosintering process time is merely a few milliseconds. The light quickly removes surface oxides from the copper particles such that the particles can form neck connections during the secondary heating as a result of the light absorbance. The increased necking density results in lower resistivity compared to thermal sintering.

Figure 10:
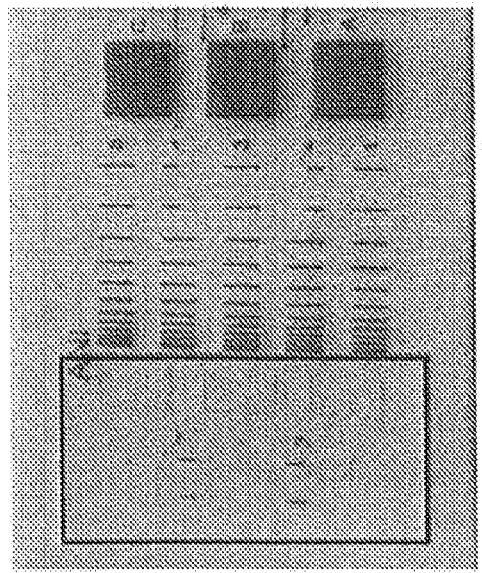
FIGS. 10-11 show digital photographs of copper paste printed on a PCB substrate. Red square shows the tape used to check adhesion of the copper film.
Figure 11:
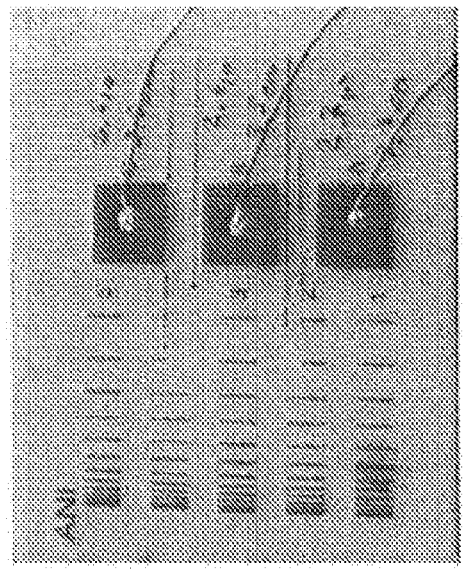
Figure 12:
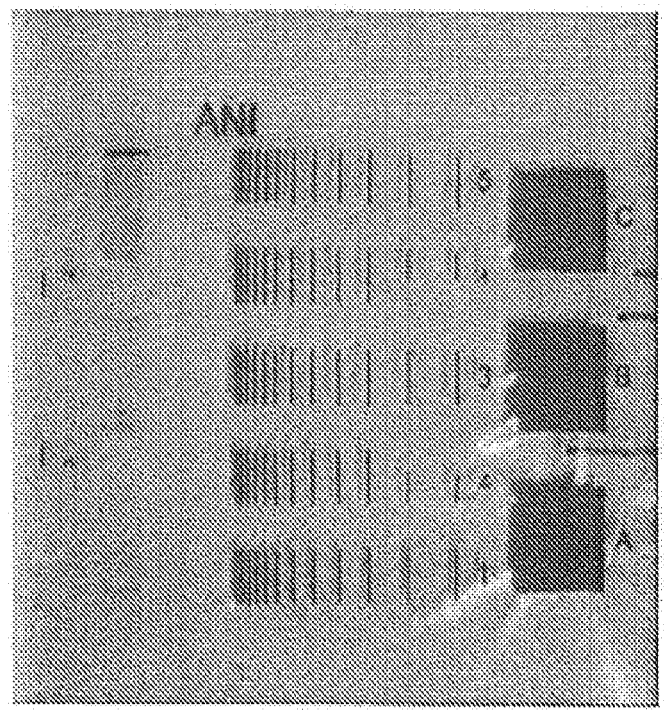
FIG. 12 shows a digital photograph of copper paste printed on a PE substrate (e.g., a Ziploc® bag). The tape used to check adhesion is shown on the left.

Printing Copper Paste on PCB Substrate and Polyethylene ("PE"):

FIGS. 10-12 show copper paste printed and photosintered on an epoxy-glass fiber PCB substrate (FIGS. 10-11) and on a PE substrate (FIG. 12). Resistivity for both substrates was approximately $4.5 \times 10^{-5}$ ohm-cm. Adhesion was good as can be seen from the tape tests. Copper wires could easily be soldered to the copper film on the PCB substrate using well-known solder, as shown in FIG. 11.

What is claimed is:

1. A method for making a conductive film comprising:
    depositing an ink or paste composition comprising micron-sized metal particles onto a polymeric substrate having a melting point less than 200° C., wherein the micron-sized metal particles in the ink or paste composition have an average particle size greater than one micron; and
    photosintering the ink or paste composition after being deposited onto the substrate, wherein during the photosintering of the ink or paste composition, some heat generated in the micron-sized metal particles as a result of the photosintering is transferred from the particles into the substrate to reduce ramping up of the heat within the particles, which also results in a partial melting of a surface of the substrate so that some of the particles physically embed into the substrate surface.

2. The method as recited in claim 1, wherein the polymeric substrate has a thermal conductivity greater than 0.1 W/mK.

3. The method as recited in claim 1, wherein the average particle size of the micron-sized metal particles in the ink or paste composition is less than three microns.

4. The method as recited in claim 1, wherein the photosintering is performed with a broad spectrum light source.

5. The method as recited in claim 1, wherein the melting point is less than 150° C.

6. The method as recited in claim 1, wherein the metal particles comprise copper.

7. The method as recited in claim 6, wherein the ink or paste composition has a formulation comprising about 50 wt. % concentration of the micron-sized copper particles, about 48 wt. % concentration of a binder solution, and about 2 wt. % concentration of a dispersant.

8. The method as recited in claim 1, wherein the metal particles are selected from the group consisting of Ag, Ni, Al, and Fe.

9. The method as recited in claim 1, wherein the polymeric substrate is comprised of PET.

10. The method as recited in claim 1, wherein the photosintered metal particles are connected to each other with necks.

11. The method as recited in claim 1, wherein the polymeric substrate has a coefficient of thermal expansion greater than two times the coefficient of thermal expansion of the photosintered ink or paste composition.

12. The method as recited in claim 1, wherein the photosintered ink or paste composition has a resulting resistivity less than $10^{-4}$ ohm-cm.

13. The method as recited in claim 1, wherein the micron-sized metal particles in the ink or paste composition have an average particle size greater than two microns.

14. The method as recited in claim 1, wherein the photosintered ink or paste composition has a resulting resistivity of at least about $6 \times 10^{-5}$ ohm-cm.

15. The method as recited in claim 1, wherein the polymeric substrate is selected from the group consisting of polyvinyl chloride, polycarbonate, polystyrene, polyethylene, and polypropylene.

16. A method for making a conductive film, comprising:
depositing an ink or paste composition comprising micron-sized metal particles onto a polymeric substrate having a melting point less than 200° C. and a thermal conductivity greater than 0.1 W/mK, wherein the micron-sized metal particles in the ink or paste composition have an average particle size greater than two microns; and photosintering the ink or paste composition after being deposited onto the substrate, wherein during the photosintering of the ink or paste composition, some heat generated in the micron-sized metal particles as a result of the photosintering is transferred from the micron-sized metal particles into the polymeric substrate to reduce ramping up of the heat within the micron-sized metal particles, which also results in a partial melting of a surface of the polymeric substrate so that some of the micron-sized metal particles physically embed into the polymeric substrate surface.

17. The method as recited in claim 16, wherein the melting point of the polymeric substrate is less than 150° C.

* * * * *